(12) United States Patent
Nishizawa et al.

(10) Patent No.: US 9,406,603 B2
(45) Date of Patent: Aug. 2, 2016

(54) SEMICONDUCTOR DEVICE AND METHOD FOR MANUFACTURING THE SEMICONDUCTOR DEVICE

(71) Applicant: FUJI ELECTRIC CO., LTD., Kawasaki-shi (JP)

(72) Inventors: Tatsuo Nishizawa, Matsumoto (JP); Shinji Tada, Hino (JP); Yoshito Kinoshita, Nagano (JP); Yoshinari Ikeda, Matsumoto (JP); Eiji Mochizuki, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 60 days.

(21) Appl. No.: 14/275,137

(22) Filed: May 12, 2014

(65) Prior Publication Data

US 2014/0246783 A1    Sep. 4, 2014

Related U.S. Application Data

(63) Continuation of application No. PCT/JP2012/082441, filed on Dec. 14, 2012.

(30) Foreign Application Priority Data

Dec. 14, 2011  (JP) .................................. 2011-272902

(51) Int. Cl.
*H01L 23/48* (2006.01)
*H01L 23/52* (2006.01)
(Continued)

(52) U.S. Cl.
CPC .......... *H01L 23/5226* (2013.01); *H01L 21/486* (2013.01); *H01L 21/76877* (2013.01);
(Continued)

(58) Field of Classification Search
CPC ................ H01L 23/49833; H01L 23/3735; H01L 23/4334; H01L 24/81; H01L 24/16; H01L 24/13; H01L 23/49811; H01L 25/072
See application file for complete search history.

(56) References Cited

U.S. PATENT DOCUMENTS

| | | | | | |
|---|---|---|---|---|---|
| 4,245,273 | A | * | 1/1981 | Feinberg | ............. H01L 23/4338 257/714 |
| 4,806,111 | A | * | 2/1989 | Nishi | ..................... H01R 4/028 439/109 |

(Continued)

FOREIGN PATENT DOCUMENTS

| | | |
|---|---|---|
| CN | 1795073 A | 6/2006 |
| JP | 61-7692 A | 1/1986 |

(Continued)

OTHER PUBLICATIONS

International Search Report for corresponding PCT/JP2012/082441, mail date Feb. 26, 2013. English translation provided.

(Continued)

*Primary Examiner* — Jarrett Stark
(74) *Attorney, Agent, or Firm* — Rossi, Kimms & McDowell LLP

(57) ABSTRACT

A semiconductor device is disclosed in which an implant board and a semiconductor element of a semiconductor mounting board are bonded and electrically connected through implant pins and which can be manufactured with high productivity. Implant pins are bonded to a semiconductor element and/or a circuit pattern of a semiconductor mounting board through cylindrical terminals press-fitted into the other ends of the implant pins. Press-fitting depth L2 of each of the implant pins into corresponding cylindrical terminals is adjustable, so that total length of the implant pin and cylindrical terminal which are press-fitted to each other matches up with the distance between the semiconductor element and/or the circuit pattern on the semiconductor mounting board and an implant board.

11 Claims, 8 Drawing Sheets

(51) Int. Cl.
*H01L 23/40* (2006.01)
*H01L 23/522* (2006.01)
*H01L 25/07* (2006.01)
*H01L 23/498* (2006.01)
*H01L 23/00* (2006.01)
*H01L 23/373* (2006.01)
*H01L 23/433* (2006.01)
*H01L 21/48* (2006.01)
*H01L 21/768* (2006.01)
*H01L 23/24* (2006.01)

(52) U.S. Cl.
CPC ........ *H01L23/3735* (2013.01); *H01L 23/4334* (2013.01); *H01L 23/49811* (2013.01); *H01L 23/49833* (2013.01); *H01L 24/13* (2013.01); *H01L 24/16* (2013.01); *H01L 24/81* (2013.01); *H01L 25/072* (2013.01); *H01L 23/24* (2013.01); *H01L 24/29* (2013.01); *H01L 24/32* (2013.01); *H01L 24/73* (2013.01); *H01L 24/83* (2013.01); *H01L 2224/131* (2013.01); *H01L 2224/13011* (2013.01); *H01L 2224/13015* (2013.01); *H01L 2224/13076* (2013.01); *H01L 2224/13082* (2013.01); *H01L 2224/13339* (2013.01); *H01L 2224/13347* (2013.01); *H01L 2224/16235* (2013.01); *H01L 2224/291* (2013.01); *H01L 2224/32225* (2013.01); *H01L 2224/45124* (2013.01); *H01L 2224/48091* (2013.01); *H01L 2224/48227* (2013.01); *H01L 2224/49111* (2013.01); *H01L 2224/49113* (2013.01); *H01L 2224/73253* (2013.01); *H01L 2224/73265* (2013.01); *H01L 2224/8121* (2013.01); *H01L 2224/8184* (2013.01); *H01L 2224/81139* (2013.01); *H01L 2224/81193* (2013.01); *H01L 2224/81815* (2013.01); *H01L 2224/81898* (2013.01); *H01L 2224/8384* (2013.01); *H01L 2224/83192* (2013.01); *H01L 2924/1305* (2013.01); *H01L 2924/13055* (2013.01); *H01L 2924/15747* (2013.01); *H01L 2924/15787* (2013.01)

(56) References Cited

U.S. PATENT DOCUMENTS

| | | | | |
|---|---|---|---|---|
| 4,816,426 A | * | 3/1989 | Bridges | H01L 21/486 174/521 |
| 4,965,227 A | * | 10/1990 | Chang | H01L 21/486 174/50.51 |
| 5,097,318 A | * | 3/1992 | Tanaka | H01L 23/057 257/690 |
| 5,299,097 A | * | 3/1994 | Kondo | H01L 23/4334 257/666 |
| 5,952,909 A | * | 9/1999 | Umeno | H01F 17/0013 29/602.1 |
| 6,121,553 A | * | 9/2000 | Shinada | H01L 23/49894 174/255 |
| 6,326,561 B1 | * | 12/2001 | Watanabe | H01L 21/486 174/260 |
| 6,372,119 B1 | * | 4/2002 | Ray | B22F 1/025 204/243.1 |
| 8,304,882 B2 | * | 11/2012 | Oka | H01L 21/565 257/687 |
| 8,436,459 B2 | * | 5/2013 | Oka | H01L 23/3735 257/691 |
| 2002/0127418 A1 | * | 9/2002 | Takeuchi | H05K 1/185 428/457 |
| 2004/0195092 A1 | * | 10/2004 | D'Astolfo, Jr. | C25C 3/12 204/280 |
| 2010/0013085 A1 | * | 1/2010 | Oi | H01L 23/3121 257/693 |
| 2010/0133681 A1 | * | 6/2010 | Oka | H01L 23/041 257/693 |
| 2011/0080714 A1 | * | 4/2011 | Tsukada | H01L 23/142 361/774 |
| 2012/0241953 A1 | | 9/2012 | Yamada et al. | |

FOREIGN PATENT DOCUMENTS

| | | |
|---|---|---|
| JP | 63-285960 A | 11/1988 |
| JP | 06-169048 A | 6/1994 |
| JP | 06-169171 A | 6/1994 |
| JP | 11-003912 A | 1/1999 |
| JP | 2000-022019 A | 1/2000 |
| JP | 2010-027814 A | 2/2010 |
| JP | 2010-129797 A | 6/2010 |
| JP | 2011-082303 A | 4/2011 |
| JP | 2011-187564 A | 9/2011 |
| WO | 2011-083737 A1 | 7/2011 |

OTHER PUBLICATIONS

Office Action issued in CN Appln. No. 201280055469.4 mailed Feb. 25, 2016. English translation provided.

* cited by examiner

SEMICONDUCTOR DEVICE AND METHOD FOR MANUFACTURING THE SEMICONDUCTOR DEVICE

BACKGROUND OF THE INVENTION

A. Field of the Invention

The present invention relates to a semiconductor device and a method for manufacturing the same. Particularly, it relates to a semiconductor device mounted with power semiconductor elements etc. and a method for manufacturing the semiconductor device.

B. Description of the Related Art

An example of a semiconductor device in which semiconductor elements are modularized has a package structure shown in FIG. 9. In the semiconductor device shown in FIG. 9, cooling plate 51 is arranged in a bottom portion of resin casing 52. Insulating wiring board 56 is arranged on cooling plate 51. Insulating wiring board 56 is configured in such a manner that metal layers 54 and 55 are bonded to opposite surfaces of insulating substrate 53. Metal layer 55 of insulating wiring board 56 and cooling plate 51 are bonded to each other through solder layer 57a. Semiconductor elements 58 are arranged on insulating wiring board 56. Metal layer 54 of insulating wiring board 56 and semiconductor elements 58 are bonded to each other through solder layer 57b. In addition, external terminals 59 are arranged on insulating wiring board 56. Metal layer 54 of insulating wiring board 56 and external terminals 59 are bonded to each other through solder layer 57c. Semiconductor elements 58 are electrically connected to external terminals 59 respectively by bonding wires 60. The inside of resin casing 52 is filled and sealed with sealing resin 61.

High heat dissipation is required particularly in the case of semiconductor elements which generate significant heat, like power semiconductor elements such as IGBTs (Insulated Gate Bipolar Transistor) etc. However, in such a semiconductor device according to the background art, bonding wires 60, for example, consisting of thin aluminum wires each having a wire diameter of about 300 μm to 400 μm are only connected to the upper surface sides of semiconductor elements 58. Moreover, since heat is generated in accordance with electricity passing through bonding wires 60, it is almost impossible to obtain any heat dissipation effect from the upper surface sides of semiconductor elements 58.

A method for improving wiring current density, fusing current resistance, bonding reliability, heat dissipation, etc. has been described in PTL 1 and PTL 2. In PTL 1 and PTL 2, an implant board and semiconductor elements of a semiconductor mounting board are bonded to each other through implant pins in place of the wire bonding wiring structure.

A semiconductor device disclosed in PTL 1 will be described with reference to FIGS. 10 and 11. Incidentally, portions substantially the same as those in the semiconductor device shown in FIG. 9 are referred to by corresponding numerals, so that description thereof will be omitted.

In the semiconductor device shown in FIG. 10, semiconductor elements 58 are arranged on insulating wiring board 56. Metal layer 54 of insulating wiring board 56 and semiconductor elements 58 are bonded to each other through solder layer 57b.

Implant board 79 is arranged above semiconductor elements 58. Implant board 79 and semiconductor elements 58 are electrically connected to each other through implant pins 76 of implant board 79.

Implant board 79 includes insulating wiring board 75, and implant pins 76 press-fitted into via holes 74. Insulating wiring board 75 is configured in such a manner that metal layers 72 and 73 forming a printed wiring are bonded to opposite surfaces of insulating substrate 71. Via holes 74 are formed to penetrate insulating substrate 71, metal layer 72 and metal layer 73 of insulating wiring board 75. Referring now to FIG. 11, collar portion 77 is provided in each implant pin 76. A constant quantity between one end of the implant pin and collar portion 77 is press-fitted into via hole 74. Collar portion 77 and insulating wiring board 75 are bonded to each other through bonding material 78a. Moreover, the other end of implant pin 76 is bonded to insulating wiring board 56 or semiconductor element 58 through bonding material 78b

PTL 1: JP-A-2011-82303
PTL 2: WO 2011/083737

SUMMARY OF THE INVENTION

However, when the component configuration in the semiconductor device shown in FIG. 10 is changed for each kind of product so that the heights of components including the semiconductor elements etc. are changed, it is necessary to adjust the length of each implant pin in accordance with the distance between the semiconductor element and the implant board in each bonding place. Therefore, it is necessary to prepare a number of implant boards in accordance with the number of the kinds of products, so that time and labor are required for inventory management of these components. In addition, a plurality of kinds of implant boards must be prepared in accordance with the kinds of products, so that the component cost increases.

Therefore, the present invention provides a semiconductor device in which an implant board and semiconductor elements of a semiconductor mounting board are bonded and electrically connected through implant pins and which can be manufactured with high productivity, and provides a method for manufacturing the semiconductor device.

The semiconductor device according to the invention is characterized in that the implant pins are bonded to a semiconductor element and/or a circuit pattern of the semiconductor mounting board through cylindrical terminals press-fitted onto the other ends of the implant pins, and the depth with which each of the implant pins is press-fitted into corresponding one of the cylindrical terminals can be adjusted so that total length of the implant pin and the cylindrical terminal which are press-fitted to each other can match up with a distance between the semiconductor element and/or the circuit pattern on the semiconductor mounting board and the implant board.

In the semiconductor device according to the invention, the implant pins are bonded to the semiconductor element and/or the circuit pattern of the semiconductor mounting board through the cylindrical terminals press-fitted onto the other ends of the implant pins. Therefore, the depth with which each of the implant pins is press-fitted into corresponding one of the cylindrical terminals can be adjusted so that the total length of the implant pin and the cylindrical terminal which are press-fitted to each other can match up with the distance between the semiconductor element and/or the circuit pattern on the semiconductor mounting board and the implant board. Accordingly, even when the distance between the semiconductor element and/or the circuit pattern on the semiconductor mounting board and the implant board differs from one bonding portion to another, it is not necessary to prepare implant pins whose lengths match up with bonding portions individually. That is, it is not necessary to change the kind of the implant board in accordance with each kind of product, but the implant board can be used in common among a plurality of products. Therefore, inventory management of the components can be easy and the component cost can be suppressed. Thus, the productivity is excellent.

In the semiconductor device according to the invention, a plating layer may be provided in a surface of a press-fitting portion of each of the implant pins into corresponding one of the cylindrical terminals and/or an inner circumferential surface of the cylindrical terminal. Preferably, the implant pin press-fitted into the cylindrical terminal is heated to melt the plating layer so that a contact portion between the implant pin and the cylindrical terminal can be bonded to each other by the plating layer.

In the semiconductor device according to the invention, a sinter material may be applied to a surface of a press-fitting portion of each of the implant pins into corresponding one of the cylindrical terminals and/or an inner circumferential surface of the cylindrical terminal. Preferably, the implant pin press-fitted into the cylindrical terminal is heated to sinter the sinter material so that a contact portion between the implant pin and the cylindrical terminal can be bonded to each other.

According to the aforementioned aspects, the bonding strength between each of the implant pins and corresponding one of the cylindrical terminals is so high that the bonding reliability is excellent.

In the semiconductor device according to the invention, preferably, each of the implant pins is in contact with at least 40% of an inner circumference of corresponding one of the cylindrical terminals in a section perpendicular to the implant pin in a contact portion between the implant pin and an inner circumferential surface of the cylindrical terminal. According to this aspect, the conductivity is excellent. Furthermore, the bonding strength between the implant pin and the cylindrical terminal is high, and the bonding reliability is excellent.

In the semiconductor device according to the invention, preferably, a protruding portion which protrudes over an outer circumference of each of the implant pins is provided in a press-fitting portion of the implant pin into corresponding one of the cylindrical terminals by drawing, so that the protruding portion can come into contact with an inner circumferential surface of the cylinder terminal. In this aspect, preferably, a value obtained by subtracting an inner diameter of each of the cylindrical terminals from a largest diameter of a press-fitting portion of corresponding one of the implant pins which has not yet been press-fitted is in the range of from 0 to 0.25 mm.

In the semiconductor device according to the invention, preferably, a straight columnar portion which is not subjected to drawing is provided in a press-fitting portion of each of the implant pins so that at least a part of the columnar portion can come into contact with an inner circumferential surface of corresponding one of the cylindrical terminals. In this aspect, preferably, a value obtained by subtracting an inner diameter of each of the cylindrical terminals from a largest diameter of a press-fitting portion of corresponding one of the implant pins which has not yet been press-fitted is in the range of from 0 to 0.15 mm.

According to the aforementioned aspects, the bonding strength between each of the implant pins and corresponding one of the cylindrical terminals is high and the bonding reliability is excellent.

In the semiconductor device according to the invention, preferably, each of the implant pins has a tapered end on the cylindrical terminal side so that the implant pin has a diameter which decreases toward the end. According to this aspect, an operation of press-fitting the implant pin into the cylindrical terminal becomes easy.

In the semiconductor device according to the invention, preferably, an inner circumference of each of the cylindrical terminals is formed into a shape which matches up with a press-fitting portion of corresponding one of the implant pins. In this aspect, the contact area of the implant pin with the inner circumference of the cylindrical terminal can be increased. Thus, the conductivity and the bonding strength are excellent.

In addition, the semiconductor device manufacturing method according to the invention is a method for manufacturing a semiconductor device, including the steps of: preparing a semiconductor mounting board in which a semiconductor element is mounted on an insulating wiring board; preparing an implant board in which via holes for electric connection are provided in an insulating substrate having a printed wiring and one ends of implant pins are press-fitted into the via holes; and bonding the other ends of the implant pins of the implant board to the semiconductor element and/or a circuit pattern of the semiconductor mounting board so as to make electric connection to the semiconductor element of the semiconductor mounting board; characterized in that: each of cylindrical terminals is press-fitted onto the other end of corresponding one of the implant pins and depth with which the cylindrical terminal is press-fitted is adjusted so that length of the implant pin can match up with a distance between the semiconductor element and/or the circuit pattern on the semiconductor mounting board and the implant board and the implant pin can be bonded to the semiconductor element and/or the circuit pattern of the semiconductor mounting board through the cylindrical terminal.

In the semiconductor device manufacturing method according to the invention, a plating layer may be formed in a surface of a press-fitting portion of each of the implant pins into corresponding one of the cylindrical terminals and/or an inner circumferential surface of the cylindrical terminal. The other end of the implant pin of the implant board is made to abut against the semiconductor element and/or the circuit pattern of the semiconductor mounting board through the cylinder terminal and the semiconductor device thus assembled is heated in a reflow furnace in this state. Thus, connection is made between the semiconductor element and the insulating wiring board and connection is made between the cylindrical terminal corresponding to the implant pin and the semiconductor element and/or the circuit pattern of the semiconductor mounting board. In addition thereto, preferably, the plating layer is melted to thereby connect the implant pin and the cylindrical terminal to each other.

In the semiconductor device manufacturing method according to the invention, a sinter material may applied in a surface of a press-fitting portion of each of the implant pins into corresponding one of the cylindrical terminals and/or an inner circumferential surface of the cylindrical terminal. The other end of the implant pin of the implant board abuts against the semiconductor element and/or the circuit pattern of the semiconductor mounting board through the cylinder terminal and the semiconductor device thus assembled is heated in a reflow furnace in this state. Thus, connection is made between the semiconductor element and the insulating wiring board and connection is made between the cylindrical terminal corresponding to the implant pin and the semiconductor element and/or the circuit pattern of the semiconductor mounting board. In addition thereto, preferably, the sinter material is sintered to thereby connect the implant pin and the cylindrical terminal to each other.

According to the invention, the implant board can be used in common among a plurality of products. Accordingly, inventory management of the components can be performed easily and the component cost can be suppressed so that a semiconductor device in which semiconductor elements are electrically connected by the implant board can be manufactured with high productivity.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
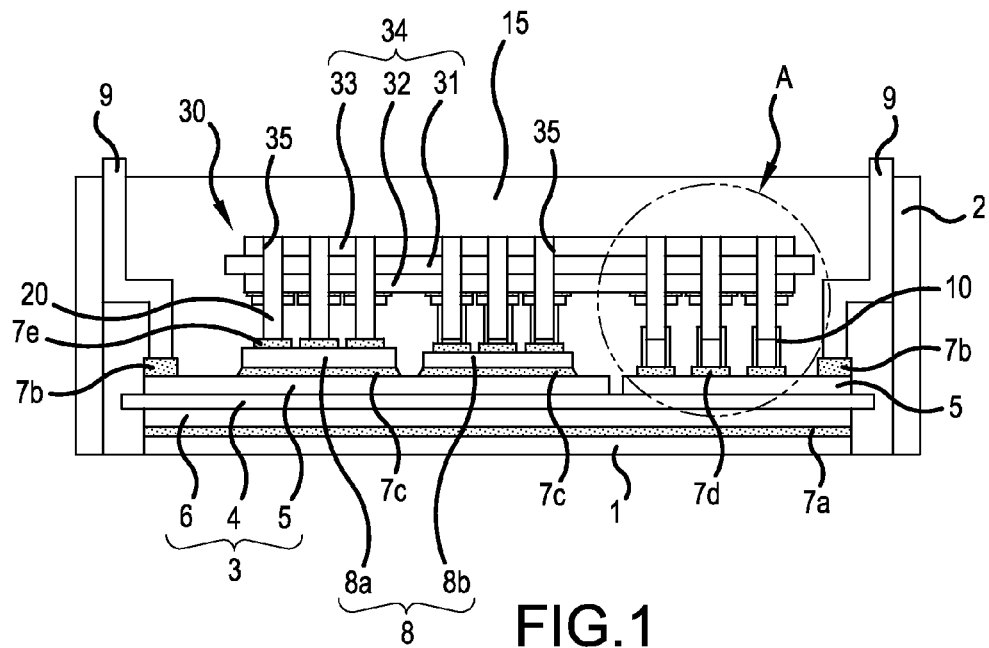
FIG. 1 is a schematic sectional view showing an embodiment of a semiconductor device according to the invention.

A semiconductor device according to the invention will be described with reference to the drawings. An embodiment of the semiconductor device according to the invention is shown in FIG. 1.

In the semiconductor device, cooling plate 1 is arranged in a bottom portion of resin casing 2. Cooling plate 1 is made of a material having high heat dissipation. For example, copper, aluminum, a copper alloy, an aluminum alloy, etc. may be used as the material of cooling plate 1.

Insulating wiring board 3 is arranged on cooling plate 1. Insulating wiring board 3 is formed in such a manner that metal layers 5 and 6 are bonded to opposite surfaces of insulating substrate 4. A predetermined circuit pattern is formed on insulating substrate 4 by metal layer 5. Metal layer 6 of insulating wiring board 3 and cooling plate 1 are bonded through a solder or sinter material layer 7a.

There is no particular limitation on insulating wiring board 3. For example, a direct bonding copper board in which a copper plate is bonded directly on a ceramic substrate, an active metal brazed copper board in which ceramics and a copper plate are bonded through a brazing material, or the like, may be used as insulating wiring board 3.

External terminals 9 are bonded to predetermined places of metal layer 5 forming the circuit pattern of insulating wiring board 3, through a solder or sinter material layer 7b. In addition, a plurality of semiconductor elements 8a and 8b are bonded to the same metal layer 5 through a solder or sinter material layer 7c. Each of semiconductor elements 8a and 8b varies according to use purposes. For example, a power semiconductor element such as an IGBT, a rectifier element such as an FWD, etc. may be used as semiconductor element 8a, 8b.

Implant board 30 is disposed above semiconductor element 8. Implant board 30 includes insulating wiring board 34, and implant pins 20 press-fitted into via holes 35. Insulating wiring board 34 is configured in such a manner that metal layers 32 and 33 forming a printed wiring are bonded to opposite surfaces of insulating substrate 31. Each of via holes 35 is formed to penetrate metal layer 32, insulating substrate 31 and metal layer 33 of insulating wiring board 34. A metal layer (not-shown) connected conductively to metal layer 32 and/or metal layer 33 is formed in an inner surface of each of via holes 35. The metal layer in the inner surface is connected conductively to implant pin 20.

Lower ends of some of implant pins 20 of implant board 30 are press-fitted into cylindrical terminals 10. In the embodiment, implant pins 20 which do not have cylindrical terminals 10 are connected to semiconductor element 8a through a solder or sinter material layer 7e. Moreover, cylindrical terminals 10 in implant pins 20 having cylindrical terminals 10 are connected to semiconductor element 8b and metal layer 5 through a solder or sinter material layer 7d.

Figure 2:
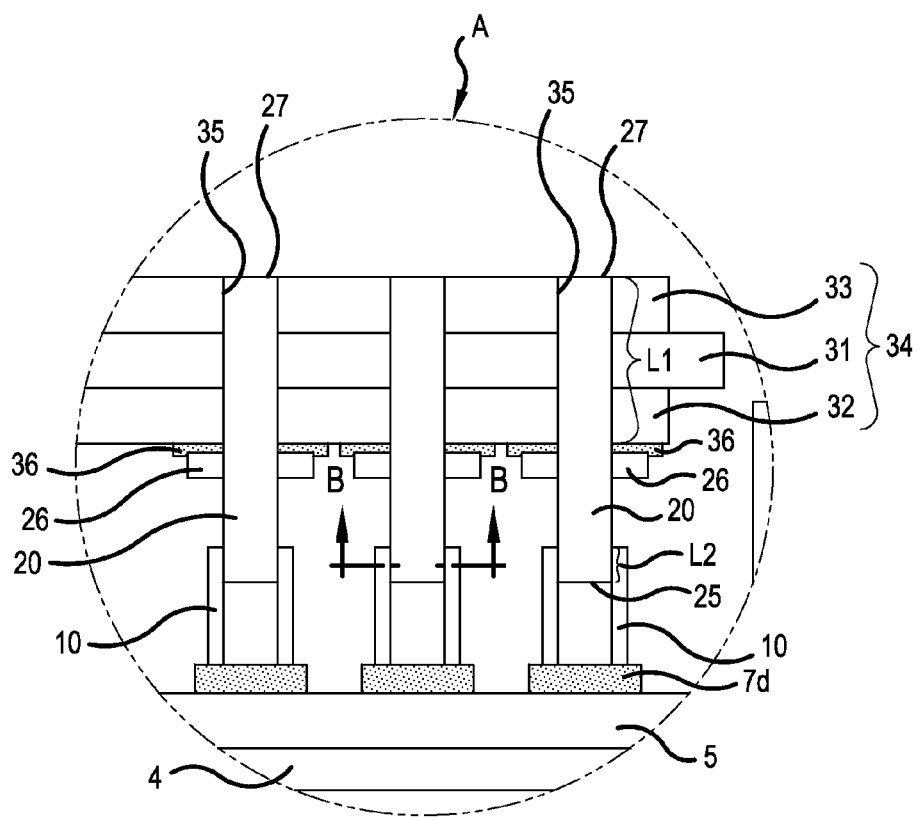
FIG. 2 is an enlarged view of a portion A in FIG. 1.

Referring now to FIG. 2, collar portion 26 is provided in each of implant pins 20. A constant quantity L1 between end 27 of each implant pin and collar portion 26 is press-fitted into pin hole 35. Each of collar portions 26 and insulating wiring board 34 are bonded through bonding material 36.

Press-fitting depth L2 of each of implant pins 20 into cylindrical terminals 10 is adjusted for each cylindrical terminal so as to match up with the distance between semiconductor element 8b and implant board 30 and the distance between metal layer 5 and implant board 30.

That is, an implant board provided with implant pins having different lengths in accordance with the distance between semiconductor element 8 and implant board 30 and the distance between metal layer 5 and implant board 30 is not used in the invention. According to the invention, the press-fitting depth of each implant pin 20 into a corresponding cylindrical terminal 10 is changed in accordance with each of the distances. Thus, implant board 30 is bonded to semiconductor element 8 or metal layer 5 to make electric connection for each of the semiconductor elements. Therefore, it is not necessary to change the implant board in accordance with each kind of product so that the implant board can be used in common among a plurality of products.

Incidentally, when the distance between implant board 30 and semiconductor element 8 or metal layer 5 matches up with the length of each implant pin 20 extending from implant board 30, implant pin 20 may be bonded to semiconductor element 8 or metal layer 5 not through cylindrical terminal 10. In the embodiment, the distance between implant board 30 and semiconductor element 8a matches up with the length of each implant pin 20 extended from implant board 30, so that implant pin 20 is bonded directly to semiconductor element 8a through a solder or sinter material layer 7e.

In the semiconductor device according to the invention, it is preferable that each implant pin 20 is in contact with 40% or more of the inner circumference of cylindrical terminal 10 in a section taken along the line B-B in FIG. 2. The section taken along the line B-B in FIG. 2 is a section in a direction perpendicular to implant pin 20, in a contact portion between implant pin 20 and the inner circumference of cylindrical terminal 10. When the contact area of implant pin 20 with cylindrical terminal 10 is smaller than 40%, bonding strength or conductivity may be insufficient. When the contact area is not smaller than 40%, sufficient bond strength and conductivity can be obtained.

In the semiconductor device according to the invention, there is no particular limitation on the shape of implant pin 20. An implant pin having any shape such as a cylindrical shape or a prismatic shape can be used as implant pin 20. For example, any of the shapes shown in FIGS. 3 to 6 may be preferably used as the shape of the press-fitting portion of implant pin 20 into cylindrical terminal 10.

Figure 3A:
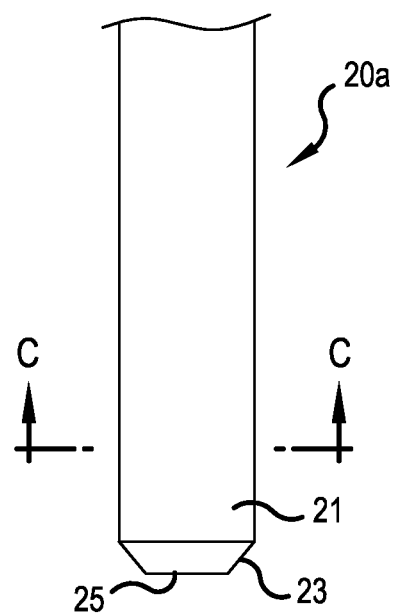
FIGS. 3(a) and 3(b) are a schematic view of an external terminal which can be used in the semiconductor device, in which 3(a) is a side view and 3(b) is a sectional view taken along the line C-C in 3(a)
Figure 3B:
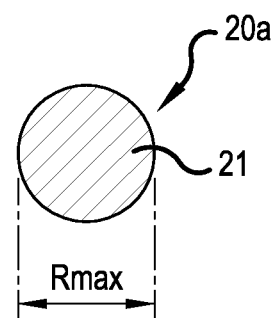

Implant pin 20a shown in FIG. 3 is provided with a press-fitting portion consisting of straight columnar portion 21 which is not subjected to drawing, and reduced diameter portion 23 whose diameter is reduced like a taper from the press-fitting portion toward end 25. When implant pin 20a is press-fitted into cylindrical terminal 10, columnar portion 21 comes into contact with the inner circumferential surface of cylindrical terminal 10, so that columnar portion 21 and cylindrical terminal 10 are bonded to each other. Moreover, since end 25 has a reduced diameter like a taper, the center position can be adjusted easily when implant pin 20a is press-fitted into cylindrical terminal 10. Thus, the press-fitting is performed easily.

The largest outer diameter $R_{max}$ of the press-fitting portion of implant pin 20 which has not yet been press-fitted is set so that a difference ($R_{max}$-R) between the largest outer diameter $R_{max}$ and an inner diameter R of cylindrical terminal 10 is preferably in the range of from 0 to 0.15 mm. In addition, the difference ($R_{max}$-R) between the largest outer diameter $R_{max}$ and the inner diameter R of cylindrical terminal 10 is more preferably in the range of from 0.05 mm to 0.15 mm, especially preferably in the range of from 0.05 mm to 0.10 mm. When the largest outer diameter $R_{max}$ is set such that the difference is within the aforementioned range, implant pin 20a can be press-fitted into cylindrical terminal 10 without causing any damage in implant pin 20a, any damage in cylindrical terminal 10, etc. so that implant pin 20a and cylindrical terminal 10 can be bonded to each other firmly.

Figure 4A:
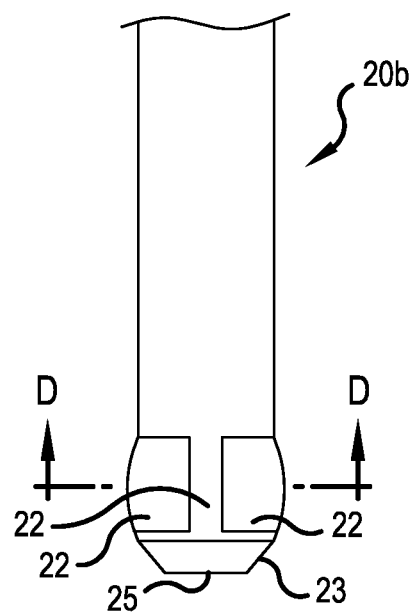
FIGS. 4(a) and 4(b) are a schematic view of an external terminal which can be used in the semiconductor device, in which 4(a) is a side view and 4(b) is a sectional view taken along the line D-D in 4(a)
Figure 4B:
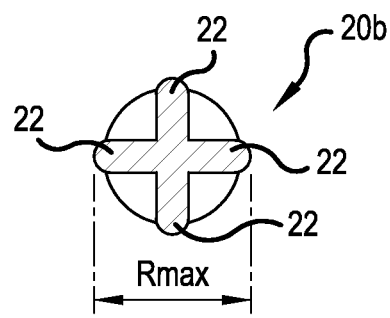
Figure 5A:
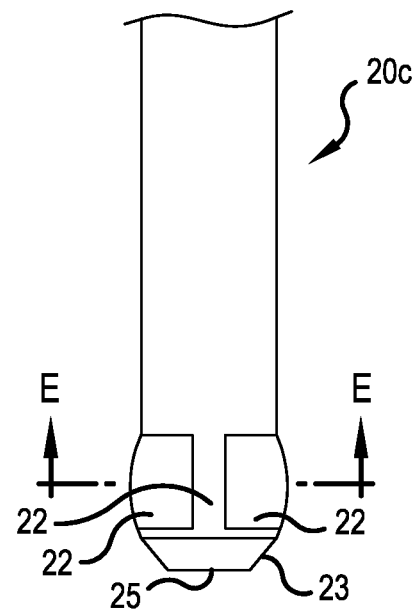
FIGS. 5(a) and 5(b) are a schematic view of an external terminal which can be used in the semiconductor device, in which 5(a) is a side view and 5(b) is a sectional view taken along the line E-E in 5(a)
Figure 5B:
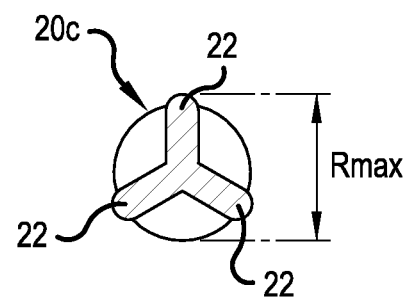
Figure 6A:
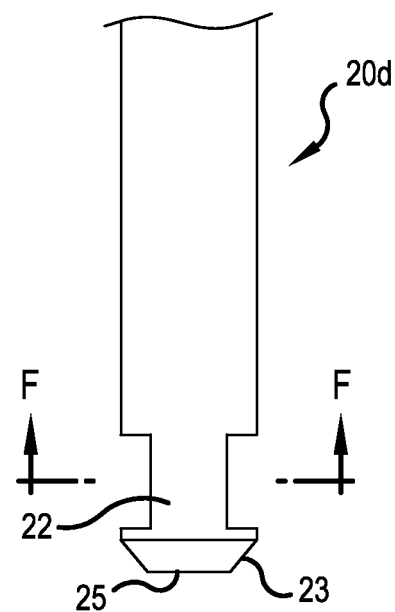
FIGS. 6(a) and 6(b) are a schematic view of an external terminal which can be used in the semiconductor device, in which 6(a) is a side view and 6(b) is a sectional view taken along the line F-F in 6(a)
Figure 6B:
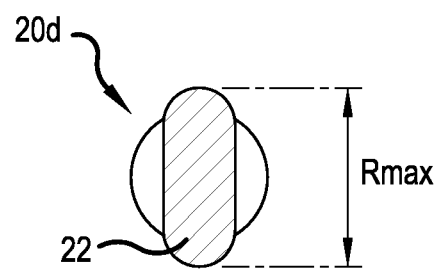

Each of implant pins 20b to 20d shown in FIGS. 4 to 6 is provided with a press-fitting portion having protruding portion 22 protruding over the outer circumference due to drawing, and reduced diameter portion 23 whose diameter is reduced like a taper from the press-fitting portion toward end 25. In implant pin 20b shown in FIG. 4, protruding portion 22 is formed into a cross shape in section. In implant pin 20c shown in FIG. 5, protruding portion 22 is formed into a Y-shape in section (a shape having three protruding parts protruding radially at equal angles). In implant pin 20d shown in FIG. 6, protruding portion 22 is formed into a flat plate shape. When the implant pin is press-fitted into cylindrical terminal 10, protruding portion 22 comes into contact with the inner circumferential surface of cylindrical terminal 10 so that protruding portion 22 and cylindrical terminal 10 are bonded to each other. Moreover, since end 25 is reduced in diameter like a taper, the center position can be adjusted easily when implant pin 20 is press-fitted into cylindrical terminal 10. Thus, the press-fitting can be performed easily. Incidentally, the shape of the protruding portion formed by drawing is not limited to any of the shapes shown in FIGS. 4 to 6.

The largest outer diameter $R_{max}$ of the press-fitting portion in each of implant pins 20b to 20d which has not yet been press-fitted is set so that a difference ($R_{max}$-R) between the largest outer diameter $R_{max}$ and the inner diameter R of cylindrical terminal 10 is preferably in the range of from 0 to 0.25 mm. Moreover, the difference ($R_{max}$-R) between the largest outer diameter $R_{max}$ and the inner diameter R of cylindrical terminal 10 is more preferably in the range of from 0.05 mm to 0.25 mm, particularly preferably in the range of from 0.10 mm to 0.20 mm. When the largest outer diameter $R_{max}$ is set so that the difference is within the aforementioned range, the implant pin can be press-fitted into cylindrical terminal 10 without causing any damage in the implant pin, any damage in cylindrical terminal 10, etc. so that the implant pin and cylindrical terminal 10 can be bonded to each other firmly.

The inner circumference of cylindrical terminal 10 is preferably shaped like a hole which matches up with the press-fitting portion of implant pin 20. Since the inner circumference of cylindrical terminal 10 is formed into a shape which matches up with the press-fitting portion of implant pin 20, the contact area of implant pin 20 with the inner circumference of cylindrical terminal 10 can be made large. In addition, the ends of protruding portions 22 engage with the inner circumferences of cylindrical terminals 10 respectively so as to prevent rotation.

The inside of resin casing 2 in the semiconductor device according to the invention is filled and sealed with sealing resin 15 such as a gel or an epoxy resin.

Next, an embodiment of a semiconductor device manufacturing method according to the invention will be described as a method for manufacturing the aforementioned semiconductor device.

First, a method for manufacturing implant board 30 will be described. Implant board 30 is manufactured as follows. Via holes 35 for electric connection are formed in predetermined positions of insulating wiring board 34 so as to penetrate metal layer 32, insulating substrate 31 and metal layer 33. After ends 27 of implant pins 20 are press-fitted into via holes 35, collar portions 26 of implant pins 20 and insulating wiring board 34 are bonded by bonding material 36.

The method for manufacturing the semiconductor device will be described below.

Insulating wiring board 3 is disposed on cooling plate 1 so that metal layer 6 side of insulating wiring board 3 can come into contact with cooling plate 1 through a solder or sinter material layer 7a. Moreover, semiconductor elements 8a and 8b are disposed on a predetermined circuit pattern of metal layer 5 of insulating wiring board 3 through a solder or sinter material layer 7c.

Next, implant pins 20 extending from implant board 30 are press-fitted into cylindrical terminals 10. The press-fitting depth of each of implant pins 20 is adjusted so that the length of implant pin 20 can match up with the distance between semiconductor element 8b and implant board 30 or the distance between metal layer 5 and implant board 30.

Implant board 30 is disposed above insulating wiring board 3. Cylindrical terminals 10 are disposed in predetermined positions of semiconductor element 8b and metal layer 5 through a solder or sinter material layer 7d. In addition thereto, implant pins 20 extending from implant board 30 are disposed on semiconductor element 8a through a solder or sinter material layer 7e.

The semiconductor device is introduced into a reflow furnace in this state so that the solder or sinter material layers 7a, 7c, 7d and 7e are melted or sintered. Thus, cooling plate 1 and metal layer 6 of insulating wiring board 3 are bonded to each other. At the same time, bonding between semiconductor elements 8a and 8b and metal layer 5 of insulating wiring board 3, bonding between cylindrical terminals 10 and metal layer 5 of insulating wiring board 3, bonding between cylindrical terminals 10 and semiconductor element 8b and bonding between implant pins 20 and semiconductor element 8a are performed.

The heating temperature in the reflow time is preferably not higher than 350° C., more preferably in the range of from 250° C. to 330° C. When the heating temperature is higher than 350° C., there is a fear that the semiconductor elements etc. may be thermally damaged.

Next, external terminals 9 are disposed in predetermined positions of metal layer 5 through a solder or sinter material layer 7b. The solder or sinter material layer 7b is melted or sintered to bond external terminals 9 and metal layer 5 to each other. Cooling plate 1 is surrounded by resin casing 2. The inside enclosed by resin casing 2 is filled with sealing resin 15. The sealing resin is hardened. In this manner, the semiconductor device according to the invention is manufactured.

Figure 7:
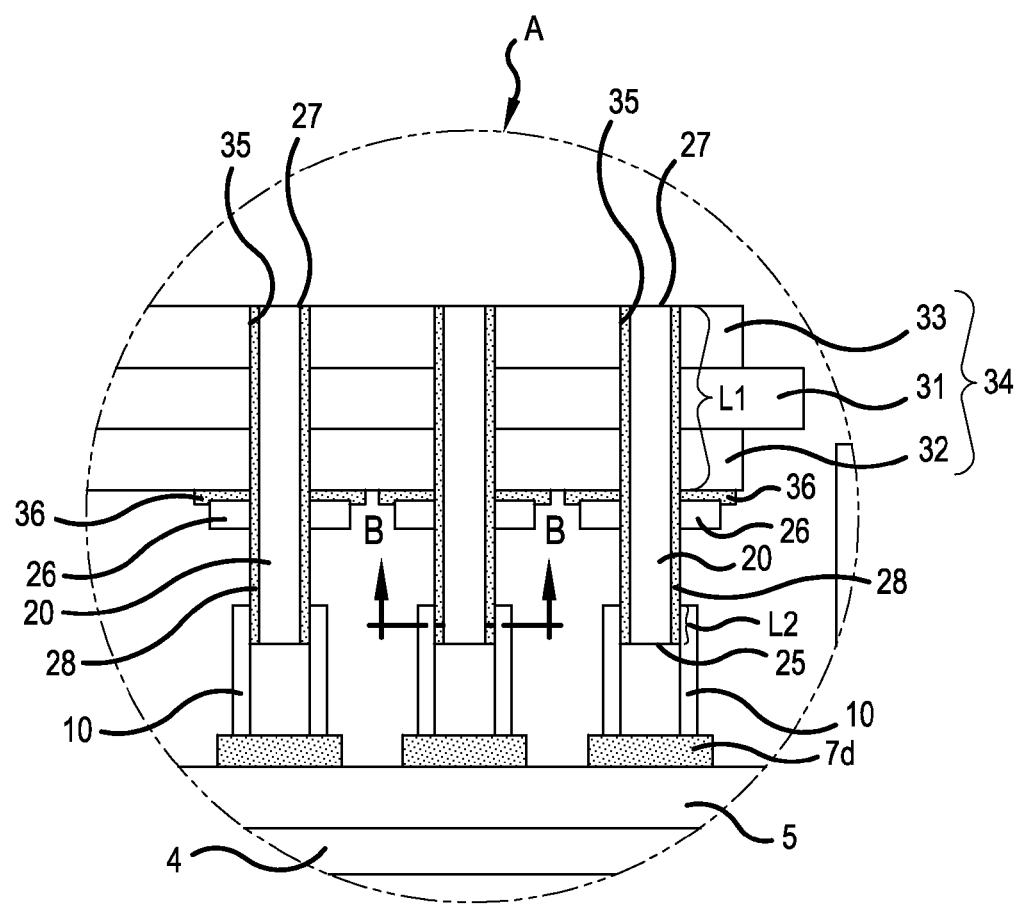
FIG. 7 is an important part enlarged sectional view showing another embodiment of the semiconductor device according to the invention.

Another embodiment of the semiconductor device according to the invention is shown in FIG. 7. In the semiconductor device, plating layer 28 is provided in the surface of the press-fitting portion of each implant pin 20 into cylindrical terminal 10. When plating layer 28 is melted, the press-fitting portion of implant pin 20 and the inner circumferential surface of cylindrical terminal 10 are bonded to each other. Incidentally, in the embodiment, the plating layer is formed in the surface of the press-fitting portion of implant pin 20. Alternatively, the plating layer may be formed in the inner circumferential surface of cylindrical terminal 10 or may be formed in both the surface of the press-fitting portion of implant pin 20 and the inner circumferential surface of cylindrical terminal 10.

The thickness of plating layer 28 is preferably not larger than 5 μm prior to press-fitting. Plating layer 28 may be a single layer or may be a laminate of a plurality of plating layers. A layer or a laminate in which at least the outermost layer can be melted at a temperature not higher than 350° C. is preferably used. Sn plating, SnAg-based solder plating, SnBi-based solder plating, SnSb-based solder plating, SnCu-based solder plating, SnIn-based solder plating, etc. may be used as the plating material whose melting temperature is not higher than 350° C. When the melting temperature is not higher than 350° C., the plating material can be melted in the reflow process for soldering the semiconductor elements etc.

Next, another embodiment of a semiconductor device manufacturing method according to the invention will be described as a method for manufacturing the aforementioned semiconductor device. In the embodiment, implant pins 20 extending from implant board 30 are press-fitted into cylindrical terminals 10 and the press-fitting depth of each of implant pins 20 is adjusted, in the same manner as in the aforementioned embodiment. In this manner, the length of each of implant pins 20 matches up with the distance between semiconductor element 8b and implant board 30 or the distance between metal layer 5 and implant board 30. Cylindrical terminals 10 are disposed in predetermined positions of semiconductor element 8b and metal layer 5 through the solder or sinter material layer 7d. Moreover, implant pins 20 extending from implant board 30 are disposed on semiconductor element 8a through the solder or sinter material layer 7e.

The semiconductor device is introduced into a reflow furnace in this state so that the solder or sinter material layers 7a, 7c, 7d and 7e and plating layer 28 are melted or sintered. Thus, through the solder or sinter material layers 7a, 7c, 7d and 7e, cooling plate 1 and metal layer 6 of insulating wiring board 3 are bonded to each other. At the same time, bonding between semiconductor elements 8a and 8b and metal layer 5 of insulating wiring board 3, bonding between cylindrical terminals 10 and metal layer 5 of insulating wiring board 3, bonding between cylindrical terminals 10 and semiconductor element 8b, and bonding between implant pins 20 and semiconductor element 8a are performed. In addition, implant pins 20 and cylindrical terminals 10 are bonded to each other respectively through plating layer 28.

The heating temperature in the reflow time is preferably not higher than 350° C., more preferably in the range of from 250° C. to 330° C. When the heating temperature is higher than 350° C., there is a fear that the semiconductor elements etc. may be thermally damaged.

External terminals 9 are disposed in predetermined positions of metal layer 5 through the solder or sinter material layer 7b. When the solder or sinter material layer 7b is melted or sintered, metal layer 5 and external terminals 9 are bonded to each other. Further, cooling plate 1 is surrounded by resin casing 2. The internal portion enclosed by resin casing 2 is filled with sealing resin 15. The sealing resin is hardened. In this manner, the semiconductor device is manufactured.

Figure 8:
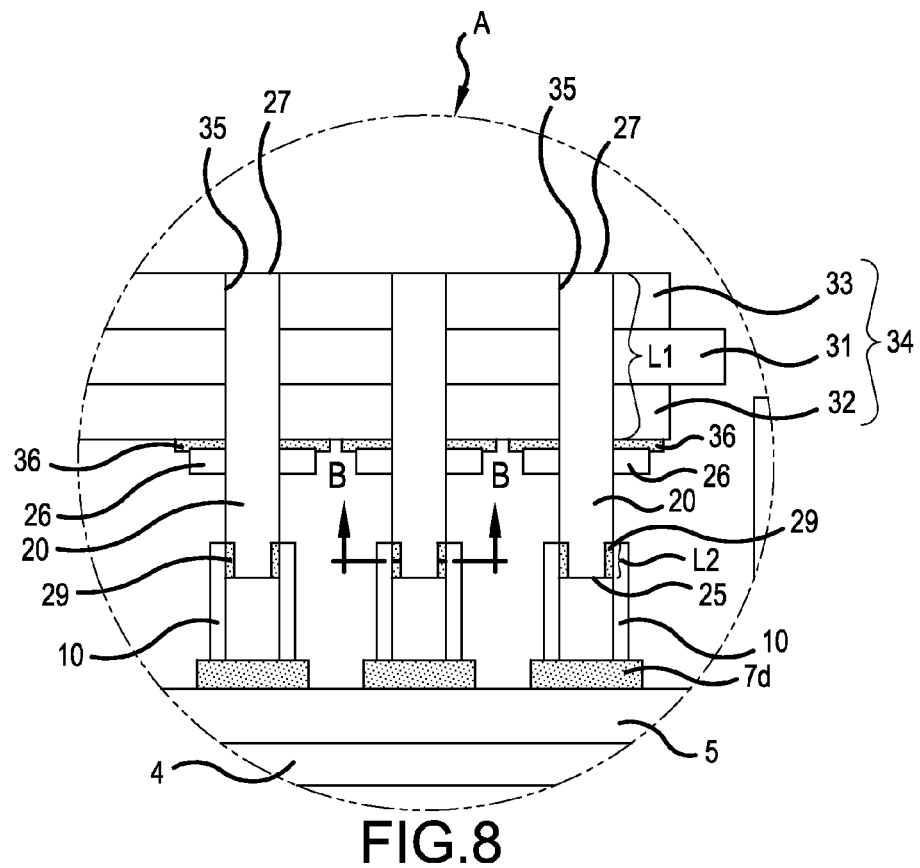
FIG. 8 is an important part enlarged sectional view showing further another embodiment of the semiconductor device according to the invention.
Figure 9:
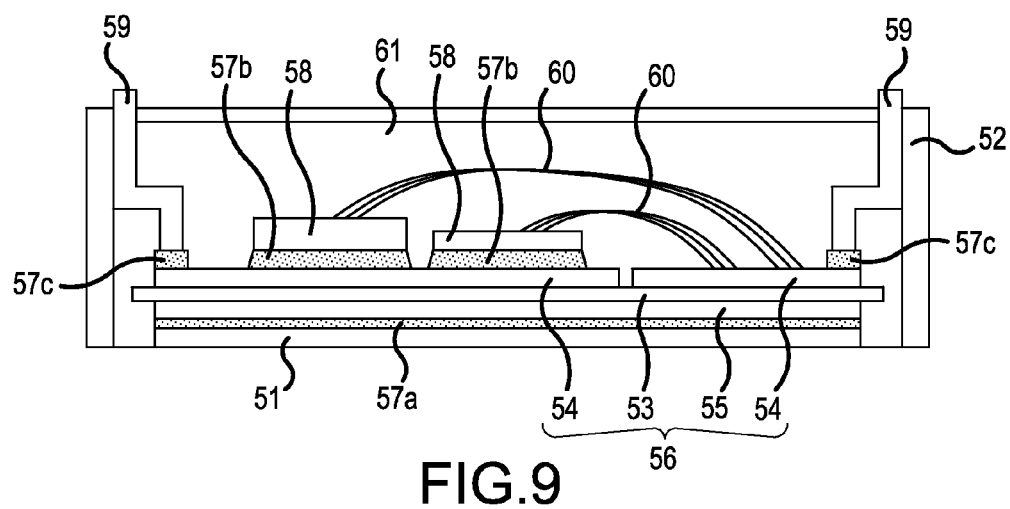
FIG. 9 is a schematic sectional view showing an example of a semiconductor device according to the background art.
Figure 10:
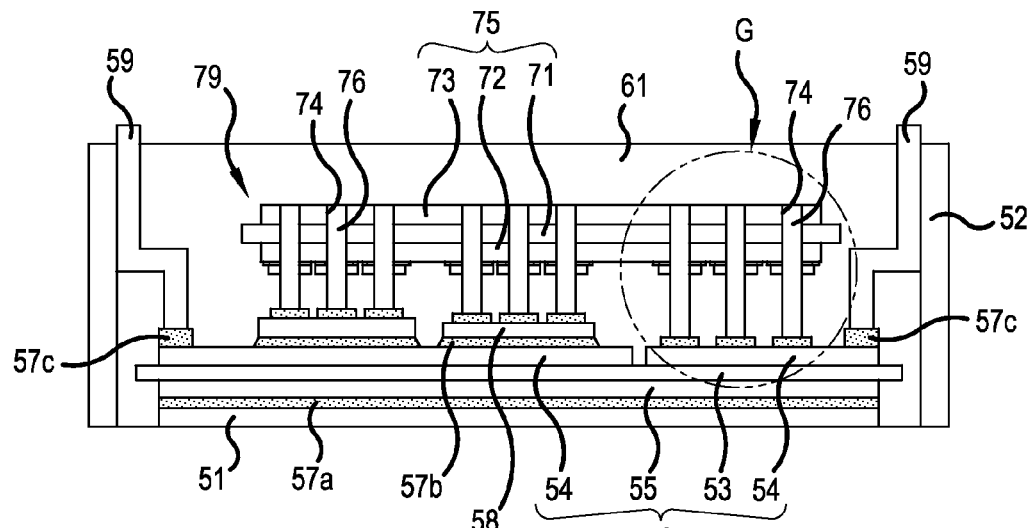
FIG. 10 is a schematic sectional view showing another example of the semiconductor device according to the background art.
Figure 11:
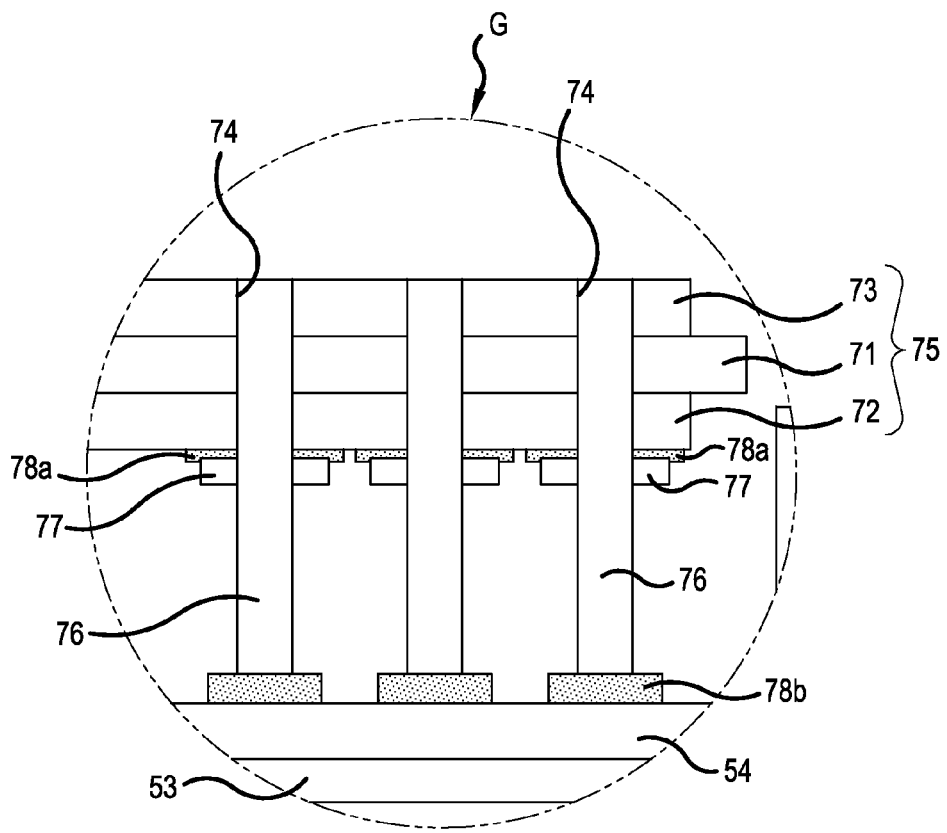
FIG. 11 is an enlarged view of a portion G in FIG. 10.

Further another embodiment of the semiconductor device according to the invention is shown in FIG. 8. In the semiconductor device, implant pins 20 are press-fitted into cylindrical terminals 10. Sinter material 29 is applied to the surfaces of the press-fitting portions of implant pins 20 into cylindrical terminals 10 and/or the inner circumferential surfaces of cylindrical terminals 10. When the sinter material is sintered, the press-fitting portions of implant pins 20 and the inner circumferential surfaces of cylindrical terminals 10 are bonded to each other.

A sinter material which can be sintered at a temperature not higher than 350° C. is preferably used as sinter material 29. For example, an Ag-based sinter material, a Cu-based sinter material, etc. may be used as sinter material 29. When the sintering temperature is not higher than 350° C., the sinter material can be sintered in the reflow process for soldering the semiconductor elements etc.

Next, another embodiment of a semiconductor device manufacturing method according to the invention will be described as a method for manufacturing the aforementioned semiconductor device.

In the embodiment, sinter material 29 is applied to the inner circumferential surfaces of cylindrical terminals 10 and/or the press-fitting portions of implant pins 20 into cylindrical terminals 10. Then, implant pins 20 extending from implant board 30 are press-fitted into cylindrical terminals 10 and the press-fitting depths of implant pins 20 are adjusted. In this manner, the lengths of implant pins 20 match up with the distance between semiconductor element 8b and implant board 30 and the distance between metal layer 5 and implant board 30. Cylindrical terminals 10 are disposed in predetermined positions of semiconductor element 8b and metal layer through the solder or sinter material layer 7d. Moreover, implant pins 20 extending from implant board 30 are disposed on semiconductor element 8a through the solder or sinter material layer 7e.

The semiconductor device is introduced into a reflow furnace in this state so that the solder or sinter material layers 7a, 7c, 7d and 7e and sinter material 29 are melted or sintered. Thus, through the solder or sinter material layers 7a, 7c, 7d and 7e, cooling plate 1 and metal layer 6 of insulating wiring board 3 are bonded to each other. At the same time, bonding between the semiconductor elements 8a and 8b and metal layer 5 of insulating wiring board 3, bonding between cylindrical terminals 10 and metal layer 5 of insulating wiring board 3, bonding between cylindrical terminals 10 and semiconductor element 8b, and bonding between implant pins 20 and semiconductor element 8a are performed. In addition thereto, implant pins 20 and cylindrical terminals 10 are bonded to each other by sintering of sinter material 29.

The heating temperature in the reflow time is preferably not higher than 350° C., more preferably in the range of from 250° C. to 330° C. When the heating temperature is higher than 350° C., there is a fear that the semiconductor elements etc. may be thermally damaged.

External terminals 9 are disposed in predetermined positions of metal layer 5 through the solder or sinter material layer 7b. When the solder or sinter material layer 7b is melted or sintered, metal layer 5 and external terminals 9 are bonded to each other. Further, cooling plate 1 is surrounded by resin casing 2. The internal portion enclosed by resin casing 2 is filled with the sealing resin 15. The sealing resin is hardened. In this manner, the semiconductor device is manufactured.

Thus, a semiconductor device and a method for manufacturing the same have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

REFERENCE SIGNS LIST

1: cooling plate
2: resin casing
3: insulating wiring board
4: insulating substrate
5, 6: metal layer
7a, 7b, 7c, 7d, 7e: solder or sinter material layer
8, 8a, 8b: semiconductor element
9: external terminal
10: cylindrical terminal
15: sealing resin
20: implant pin
28: plating layer
29: sinter material
30: implant board
31: insulating substrate
32, 33: metal layer
34: insulating wiring board
35: via hole
36: bonding material
51: cooling plate
52: resin casing
53: insulating substrate
54, 55: metal layer
56: insulating wiring board
58: semiconductor element
59: external terminal
60: bonding wire
61: sealing resin
71: insulating substrate
72, 73: metal layer
74: via hole
75: insulating wiring board
76: implant pin
79: implant board

What is claimed is:
1. A semiconductor device comprising:
a semiconductor mounting board in which a plurality of semiconductor elements are mounted on an insulating wiring board, the semiconductor mounting board having a circuit pattern;
an implant board in which via holes for electrical connection are provided in an insulating substrate having a printed wiring, and
implant pins, first ends of which are press-fitted into the via holes and second ends of which are bonded to the semiconductor element and/or the circuit pattern of the semiconductor mounting board such that there is an electrical connection to the semiconductor element of the semiconductor mounting board,
wherein distance between (i) the implant board and (ii) the semiconductor elements and/or the circuit pattern of the semiconductor mounting board varies, and
wherein the implant pins are bonded to the semiconductor element and/or the circuit pattern of the semiconductor mounting board through cylindrical terminals press-fitted onto the second ends of the implant pins, and in the semiconductor device a depth with which each of the implant pins is press-fitted into corresponding ones of the cylindrical terminals varies so that total length of the implant pin and the cylindrical terminal which are press-fitted to each other match up with a distance between the semiconductor element and/or the circuit pattern on the semiconductor mounting board and the implant board.

2. A semiconductor device according to claim 1, wherein a plating layer is provided on a surface of a press-fitting portion of each of the implant pins and/or on an inner circumferential surface of the cylindrical terminal, such that the plating layer bonds the implant pin press-fitted into the cylindrical terminal to the cylindrical terminal when the plating layer is heated and melted.

3. A semiconductor device according to claim 1, wherein a sinter material is on a surface of a press-fitting portion of each of the implant pins and/or on an inner circumferential surface of the cylindrical terminal, such that the sinter material bonds the implant pin press-fitted into the cylindrical terminal to the cylindrical terminal when the sinter material is heated.

4. A semiconductor device according to claim 1, wherein each of the implant pins contacts at least 40% of an inner circumference of a corresponding cylindrical terminal in a section perpendicular to the implant pin in a contact portion between the implant pin and the inner circumferential surface of the cylindrical terminal.

5. A semiconductor device according to claim 1, wherein a protruding portion protruding over an outer circumference of each of the implant pins is provided in a press-fitting portion of the implant pin corresponding to one of the cylindrical terminals by drawing so that the protruding portion can come into contact with an inner circumferential surface of the cylinder terminal.

6. A semiconductor device according to claim 5, wherein a value obtained by subtracting an inner diameter of each of the cylindrical terminals from a largest diameter of a press-fitting portion of corresponding one of the implant pins is in the range of from 0 to 0.25 mm.

7. A semiconductor device according to claim 1, wherein a straight columnar portion which has not been subjected to drawing is provided in a press-fitting portion of each of the implant pins, so that at least a part of the columnar portion contacts an inner circumferential surface of a corresponding cylindrical terminal.

8. A semiconductor device according to claim 7, wherein a value obtained by subtracting an inner diameter of each of the cylindrical terminals from a largest diameter of a press-fitting portion of corresponding one of the implant pins is in the range of from 0 to 0.15 mm.

9. A semiconductor device according to claim 1, wherein each of the implant pins has a tapered end on the cylindrical terminal side, so that the implant pin has a diameter which decreases toward the end.

10. A semiconductor device according to claim 1, wherein an inner circumference of each of the cylindrical terminals has a shape which matches up with a press-fitting portion of a corresponding implant pin.

11. A semiconductor device according to claim 1, wherein the implant pins comprise a first pin and a second pin having substantially the same length, wherein the second end of the first pin is bonded to the semiconductor element and the second end of the second pin is bonded to the semiconductor element and/or the circuit pattern of the semiconductor mounting board through the cylindrical terminals.

* * * * *